United States Patent [19]
Maue et al.

[11] Patent Number: 5,300,917
[45] Date of Patent: Apr. 5, 1994

[54] JUNCTION BOX HAVING INTEGRALLY FORMED SHUNT

[76] Inventors: H. Winston Maue, 21789 Glenwild Dr., Northville, Mich. 48167; Zenon Hotra, 2654 Fox Chase, Troy, Mich. 48098; Tomoyuki Yamai, 10-28-101 Seri-machi, Hikone, Shiga pref., 522, Japan

[21] Appl. No.: 6,438

[22] Filed: Jan. 15, 1993

[51] Int. Cl.$^5$ .......................... H01C 7/00; H02B 1/20
[52] U.S. Cl. ...................................... 338/49; 361/648; 338/226; 338/232
[58] Field of Search .................. 338/49, 226, 232; 361/361, 341, 342, 68

[56] References Cited
U.S. PATENT DOCUMENTS

| | | | |
|---|---|---|---|
| 4,096,541 | 6/1978 | Bohin et al. | 361/120 |
| 4,689,718 | 8/1987 | Maue et al. | 361/360 |

OTHER PUBLICATIONS

"A Comprehensive Guide To Resistive Shunts And Current Sensors", Vishay Electronic Components, Catalog CO191, 1991.

Primary Examiner—Marvin M. Lateef

[57] ABSTRACT

A junction box incorporating an integrally formed shunt busbar. The shunt busbar incorporates a first pair of terminals to act as leads to couple the shunt busbar in a current loop of a circuit, and a second pair of terminals to couple a voltage sensing device across a portion of the shunt busbar. The voltage sensing device is preferably a high input impedance voltage comparator. The input impedance of the voltage comparator is great enough to negate the affect of the internal resistance of the mating terminals of the busbar. Furthermore, the second pair of terminals is located on the shunt busbar such that the terminal resistances thereof are outside of the current loop. The electrical busbar is preferably mounted in a suitable insulating housing. When the shunt busbar of the present invention is connected to the high input impedance voltage comparator, a circuit path that allows for easily and accurately measuring the voltage drop across the busbar is made possible. This is accomplished while maintaining adequate current flow to the load for testing purposes.

10 Claims, 6 Drawing Sheets

JUNCTION BOX HAVING INTEGRALLY FORMED SHUNT

BACKGROUND OF THE INVENTION

This invention relates generally to electrical test devices and, more particularly, to electrical test shunts for measuring current. Test shunts generally require some sort of mating terminals to connect the shunt to the circuit in which current is to be measured. The resistance of the shunt mating terminals greatly affects the resistance of the shunt and the accuracy of the current measurement. The amount of resistance added to the circuit is typically more than is acceptable to provide accurate current measurements. Furthermore, it is difficult to compensate for this additional resistance.

The prior art has not addressed the issue of providing a shunt element as an integral part of a junction box. Junction boxes are typically either two or three dimensional mechanical arrays of electrical conducting metal frets that typically join electrical wires with electronic modules within an electrical distribution system. The prior art has further failed to address the issue of providing a junction box having a shunt which can be coupled in a current loop of a circuit in a manner such that the terminal resistances of a voltage sensing apparatus are located outside of the current loop being monitored when the junction box and shunt are coupled in the circuit, to thereby prevent the terminal resistances from adversely affecting the accuracy of the current measurement calculated from the voltage measurement taken across the shunt.

Accordingly, it is a principal object of the present invention to virtually eliminate the affect of terminal resistance in the calculation of a load current by integrating a shunt in a junction box as part of an electrical conductor array.

It is an additional object of the present invention to provide a shunt in a junction box that provides a sufficiently accurate resistance necessary to accurately measure a voltage from which a load current may be calculated.

It is yet another objective of the present invention to provide a shunt formed integrally with a junction box, to thereby provide a single apparatus which performs all of the functions of a common junction box as well as providing a readily available shunt for accurate current measurements, and where the apparatus is economical to manufacture.

SUMMARY OF THE INVENTION

The above and other objects are accomplished by a junction box apparatus having an integrally formed shunt in accordance with a preferred embodiment of the present invention. The apparatus is preferably formed using metal fret junction box technology. The apparatus of the present invention incorporates using metal fret junction box technology to form a shunt from a busbar, in which the shunt has a first pair of terminals which allow it to be coupled in a current loop of a circuit to be tested. The second pair of terminals allow a voltage sensing apparatus to be coupled to the integrally formed shunt such that the internal resistances of the terminals are located outside of the current loop, and therefore do not adversely influence voltage measurements made by the voltage sensing device across the shunt.

The voltage across the shunt is preferably measured by an external, high input impedance voltage comparator. The input impedance of the voltage comparator is further great enough to negate the affect of the internal resistance of the terminals located outside of the current loop of the shunt.

Accordingly, when the shunt of the present invention is connected to a high input impedance voltage comparator, a circuit path that allows for easily and accurately measuring the voltage drop across the shunt is made possible. This is accomplished while maintaining adequate current flow to the load for testing purposes.

The apparatus of the present invention further provides an economy heretofore not realized by prior devices, which typically required separate junction boxes and shunt elements. Accordingly, by the apparatus of the present invention the functions of a junction box and a shunt can be performed by a single apparatus without introducing appreciable error into voltage measurements made across the shunt of the apparatus.

BRIEF DESCRIPTION OF THE DRAWINGS

The various advantages of the present invention will become apparent to one skilled in the art by reading the following specification and subjoined claims, and by referencing the following drawings in which:

DETAILED DESCRIPTION OF THE PREFERRED EMBODIMENT

Figure 1:
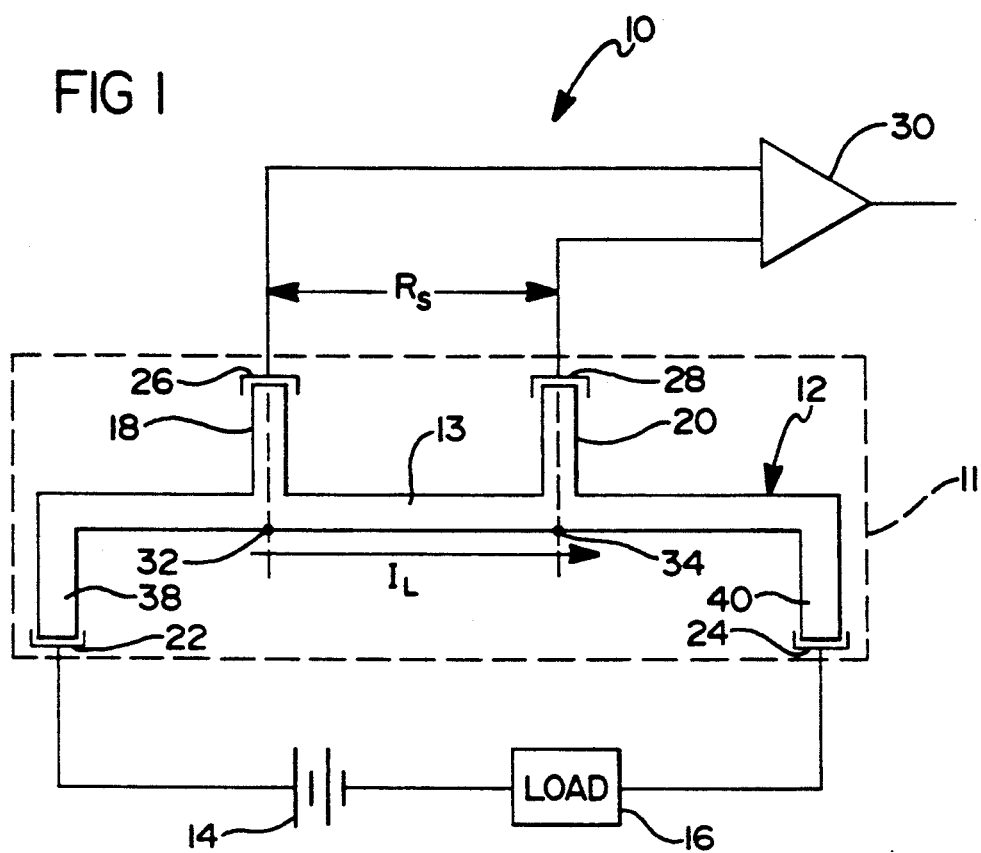
FIG. 1 is an illustration of a junction box apparatus in accordance with a preferred embodiment of the present invention showing an integrally formed electrical busbar shunt thereof coupled to an external load, an external power supply and an external comparator to measure a voltage drop across the shunt busbar.

Referring to FIG. 1, a junction box apparatus 10 in accordance with a preferred embodiment of the present invention is shown. The apparatus 10 generally includes a junction box 11 having an integrally formed shunt busbar 12. In the preferred embodiment the shunt busbar 12 comprises a metal fret shunt busbar. The shunt 12 is generally comprised of a body portion 13, a pair of male terminals in the form of blades 18 and 20, and a pair of male terminals 38 and 40 in the form of blades for coupling the shunt 12 in a current loop within which a load 16 and a power supply 14 are placed. The shunt busbar 12 is coupled within a circuit at four electrical connection points 22 and 24, 26 and 28 using external female terminals. A comparator 30 is then connected at points 26 and 28 to measure the voltage drop across the shunt busbar 12. The power supply 14 provides current $I_L$ through the load 16 and the shunt busbar 12 to produce the voltage drop between the electrical connection point 26 and the electrical connection point 28.

The voltage testing portion of the circuit shown in FIG. 1 is generally comprised of the shunt busbar 12, the terminals 18 and 20, the electrical connection points 26 and 28, and the comparator 30. The comparator 30 is preferably a high input impedance operational amplifier. The input impedance of comparator 30 is so high as to virtually eliminate the current flow through electrical connection point 26 and the electrical connection point 28.

The shunt busbar 12 is preferably manufactured by stamping an electrical conductor from flat copper or brass stock. During this manufacturing process, the terminals 18, 20, 22 and 24 are formed in the shape of "blades" which can couple easily to suitable mating female receptacles. The shunt busbar 12 has an electrical resistivity between any given point A and point B that can be used to calculate resistance as described in Equation 1, as follows:

$$R_{PTA-PTB} = \rho \frac{L}{A}$$

where,
$\rho$ = Electrical resistivity of the material;
L = Distance between $P_TA$ and $P_TB$; and
A = Cross sectional area of the shunt busbar 12.

Since the resistance of the shunt busbar 12 is proportional to the length divided by the area as shown in Equation 1 above, various voltage potentials exist across varying lengths of the shunt busbar 12. The preferred embodiment of the present invention uses the precise resistance between two predetermined points on the shunt body 13 (i.e., points 32 and 34 in FIG. 1), and the measured voltage drop thereacross, to calculate the current $I_L$ flowing through the shunt busbar 12. Therefore, the resistance between test point 32 and test point 34 is a constant that, once determined accurately, can be used in conjunction with the voltage drop measured by the comparator 30 to accurately calculate the current $I_L$ flowing to the load 16.

The terminals 18 and 20 also demonstrate the same electrical resistivity characteristics as the rest of shunt busbar 12. However, the resistance of the terminals 18 and 20 does not affect the voltage reading at comparator 30 since very little current flows through these terminals due to the high input impedance of the comparator 30.

The shunt can be calibrated by reducing its cross sectional area, known generally in the art as "trimming", to thus controllably increase the resistance $R_S$ in the shunt busbar 12 between the points 32 and 34. Furthermore, the section of the shunt busbar 12 between the points 32 and 34 can be made of materials having different resistive characteristics to suit the needs of specific applications. For example, a material such as brass may be used to form the shunt busbar 12.

Figure 2:
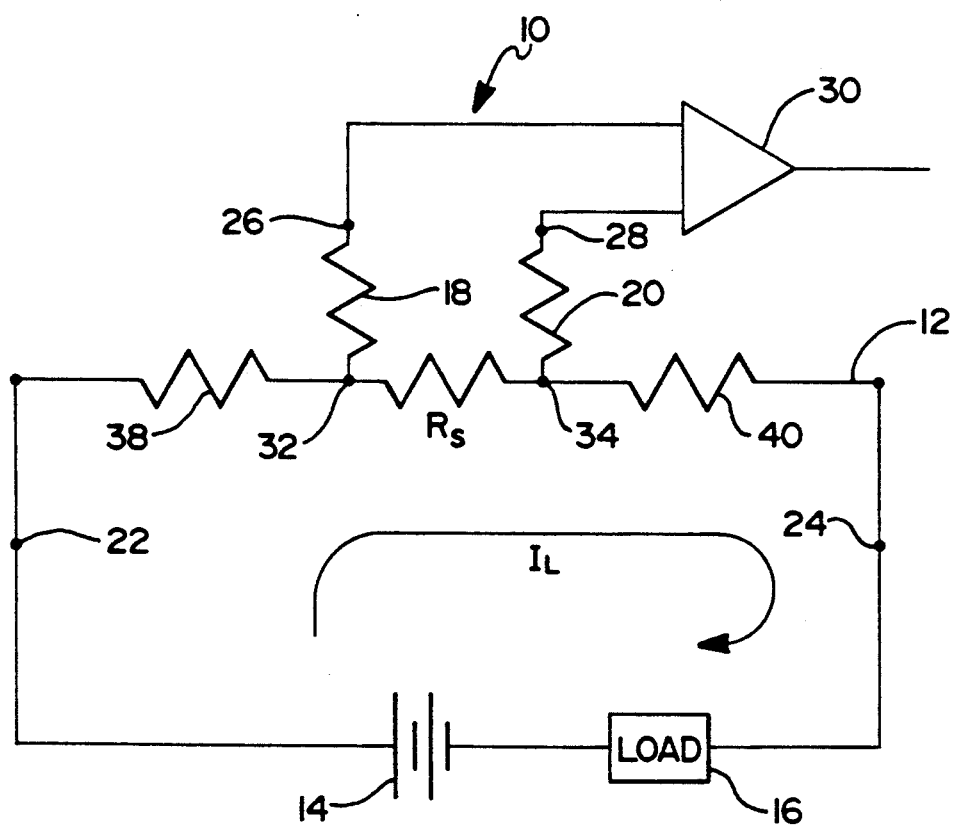
FIG. 2 is a schematic diagram of the preferred embodiment of the present invention showing the individual electrical resistances of the individual components of the junction box apparatus of FIG. 1.

Referring to FIG. 2, the apparatus 10 is shown as part of an electrical schematic diagram. The power supply 14 provides current $I_L$ through the load 16 and the shunt busbar 12. The voltage testing portion of the circuit is generally comprised of the shunt busbar 12, the terminals 18 and 20, the electrical connection points 26 and 28, and the comparator 30. The terminals 18 and 20 are shown representatively as electrical resistors. The current loop portion of the circuit is generally comprised of the shunt busbar 12, the terminals 38 and 40 representing load carrying blades, electrical connection points 22 and 24, and resistance ($R_S$). Connection point 22 represents the interface between the shunt busbar 12 and the power supply 14, while connection point 24 represents the interface between the shunt busbar 12 and the load 16. These resistors graphically illustrate how the shunt busbar 12 is a continuous electrical resistance. It should be appreciated that resistances 38, 40, and resistance $R_S$ each affect the current $I_L$. Conversely, resistances 18 and 20 do not affect the current $I_L$ since the input impedance of the comparator 30 is high enough to prevent virtually any current from flowing through resistances 18 and 20.

Figure 3:
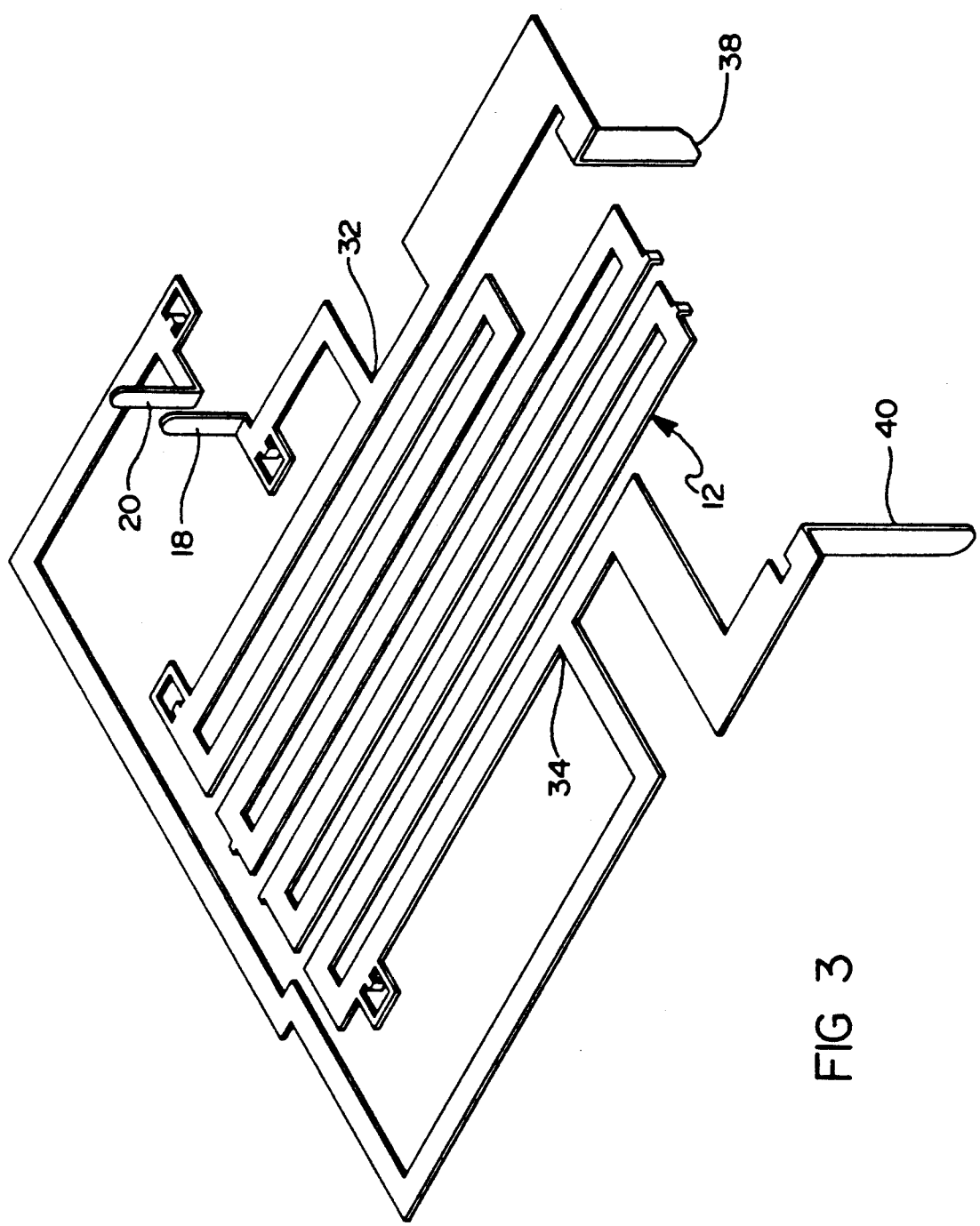
FIG. 3 is a perspective view of the shunt busbar of the junction box apparatus of the present invention.

Referring to FIG. 3, the shunt busbar 12 is shown in a preferred embodiment as a metal fret shunt busbar 12 specifically configured for use in an automobile junction box. The shunt busbar 12 is generally comprised of the terminals 18 and 20 in the form of voltage sensing blades. Points 32 and 34 represent the connections between terminals 18 and 20 and the shunt resistance $R_S$ and terminals 38 and 40.

In this illustrated embodiment, the shunt busbar 12 is configured to provide a predetermined shunt resistance of about 15 milliohms. In addition to providing an integrally formed shunt, the apparatus 10 also functions to electrically interconnect electrical circuits as required for a specific application. Accordingly, an accurate shunt resistance is readily provided within the junction box apparatus 10 in an economical manner to obviate the need for including a separately formed shunt.

Figure 4:
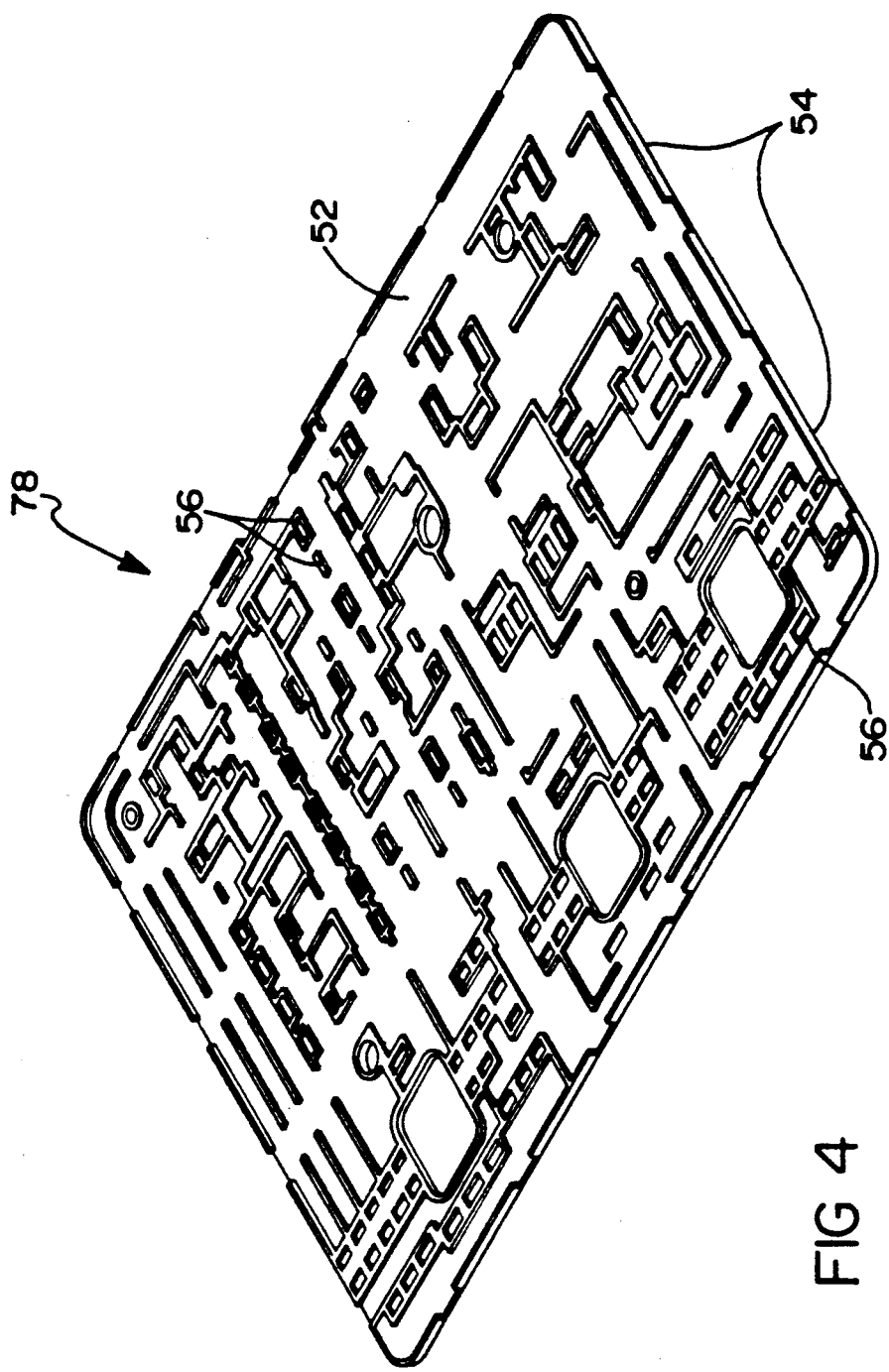
FIG. 4 is a perspective view of an insulating plate used in the junction box apparatus.

Referring to FIG. 4, an insulation plate 78 of the junction box apparatus 10 is shown. The insulation plate 78 is generally comprised of a dielectric material 52, side rails 54, and a number of openings 56. The insulation plate 78 provides dielectric isolation between fret layers in a junction box. The insulation plate 78 is generally comprised of Valox 732E or any other suitable dielectric material. Valox 732E is a readily known material that is frequently used in junction boxes since it demonstrates a high heat deflection temperature, high impact characteristics, low water absorption, and excellent dimensional stability. The side rails 54 are provided to aid in the assembly of the plurality of busbars which the junction box apparatus 10 may include, while the openings 56 provide paths for the terminals of various busbars.

Figure 5:
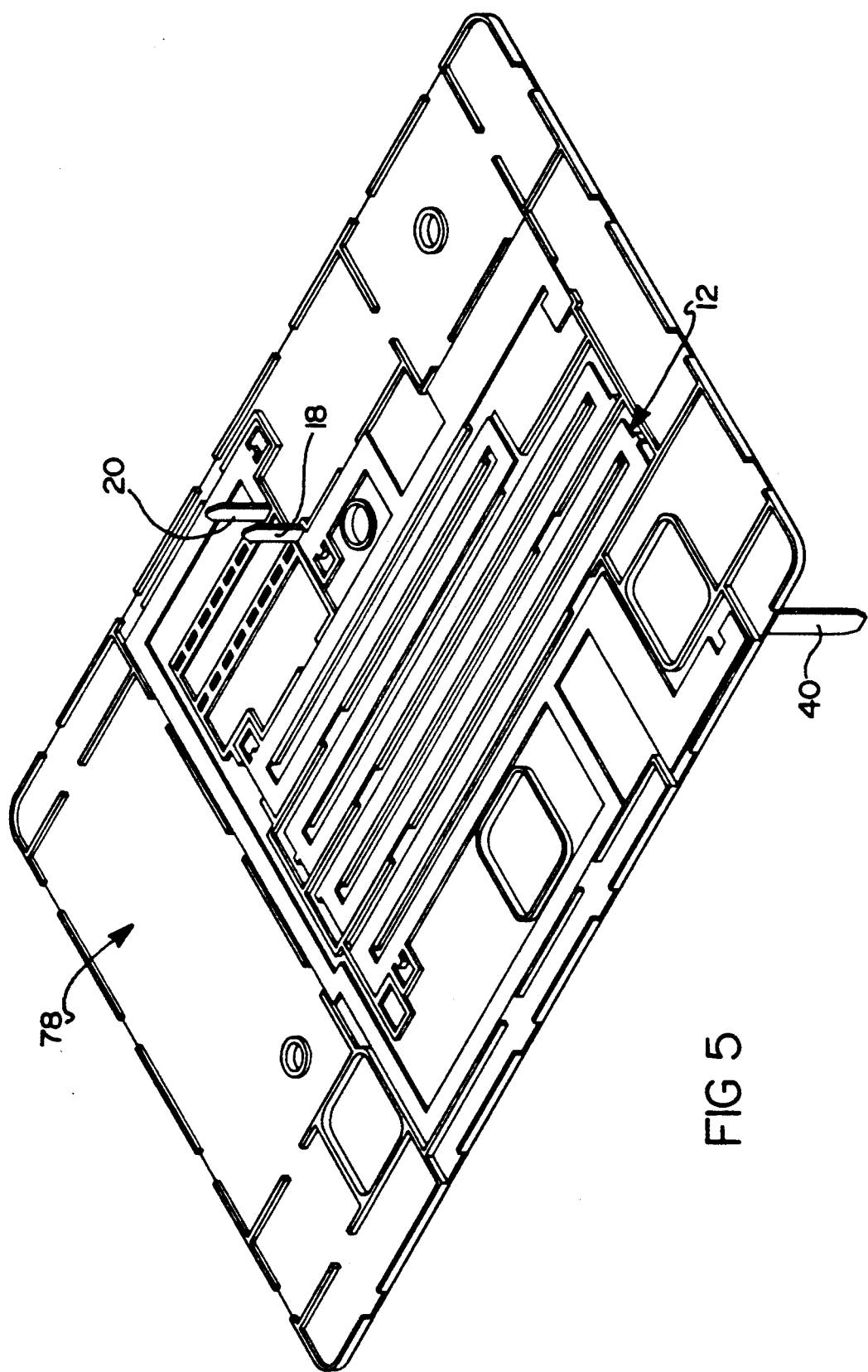
FIG. 5 is a perspective view of the shunt busbar as it may be placed adjacent the insulating plate.

Referring to FIG. 5, the shunt busbar 12 is shown in place against the insulating plate 78 of the junction box apparatus 10. The shunt busbar 12 has overall dimensions which enable it to be electrically isolated by the insulating plate 78 from other busbars within the junction box apparatus 10.

Figure 6:
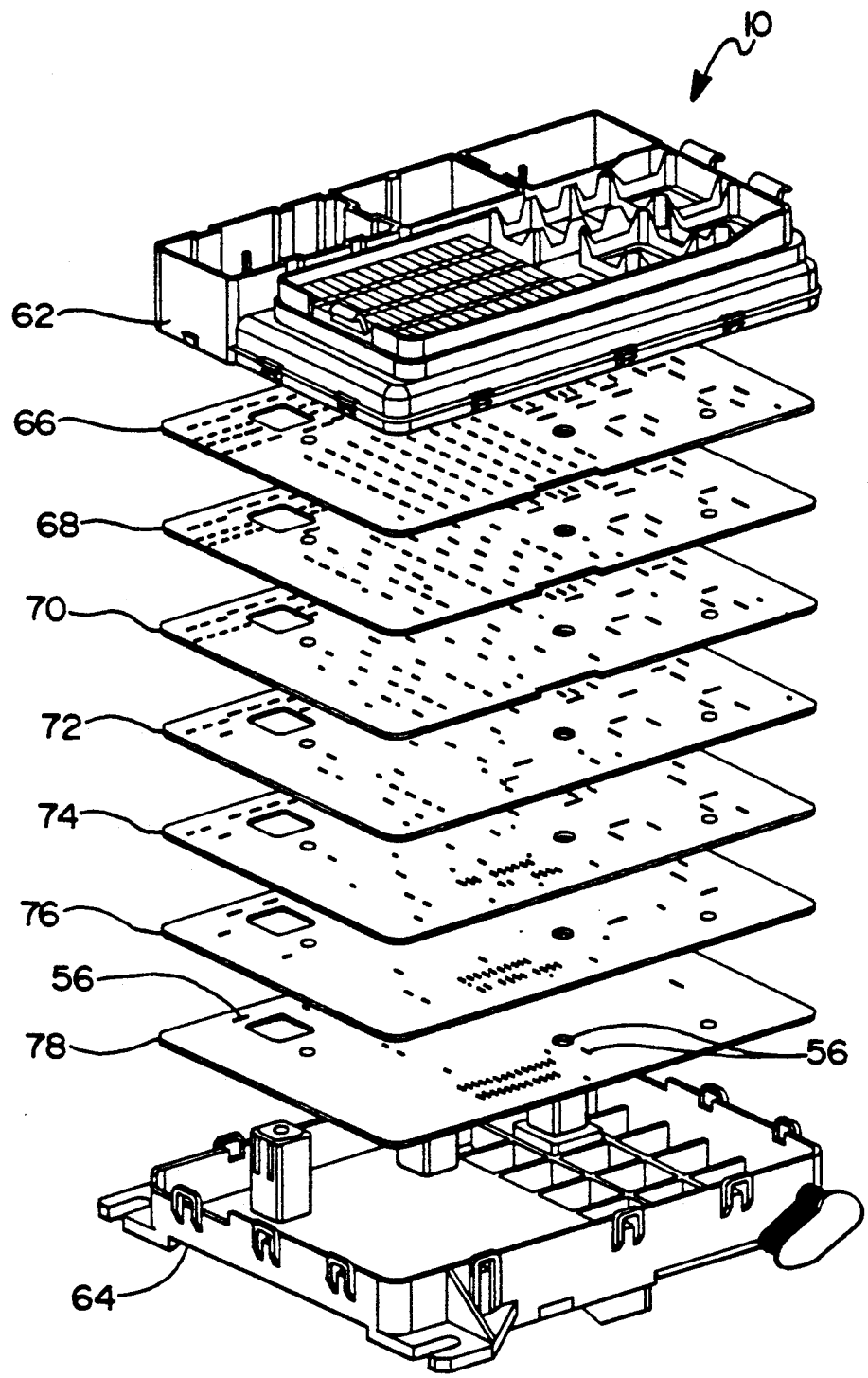
FIG. 6 is an exploded perspective view of the junction box apparatus showing several individual insulation plates and the upper and lower case members of the junction box apparatus.

Referring to FIG. 6, a more detailed exploded perspective view of the junction box apparatus 10 is shown. The junction box apparatus 10 further preferably comprises an upper case member 62, a lower case member 64, and a plurality of insulating plates 66, 68, 70, 72, 74, 76, and 78. The shunt busbar 12 is generally located between insulation plate 78 and lower case 64, although it should be appreciated that it could be placed at any other location between the case members 62 and 64 provided it is electrically isolated by one or more of the insulating plates 66–78 from other busbars included therein. The terminals 38 and 40 generally protrude through the openings 56.

Figure 7:
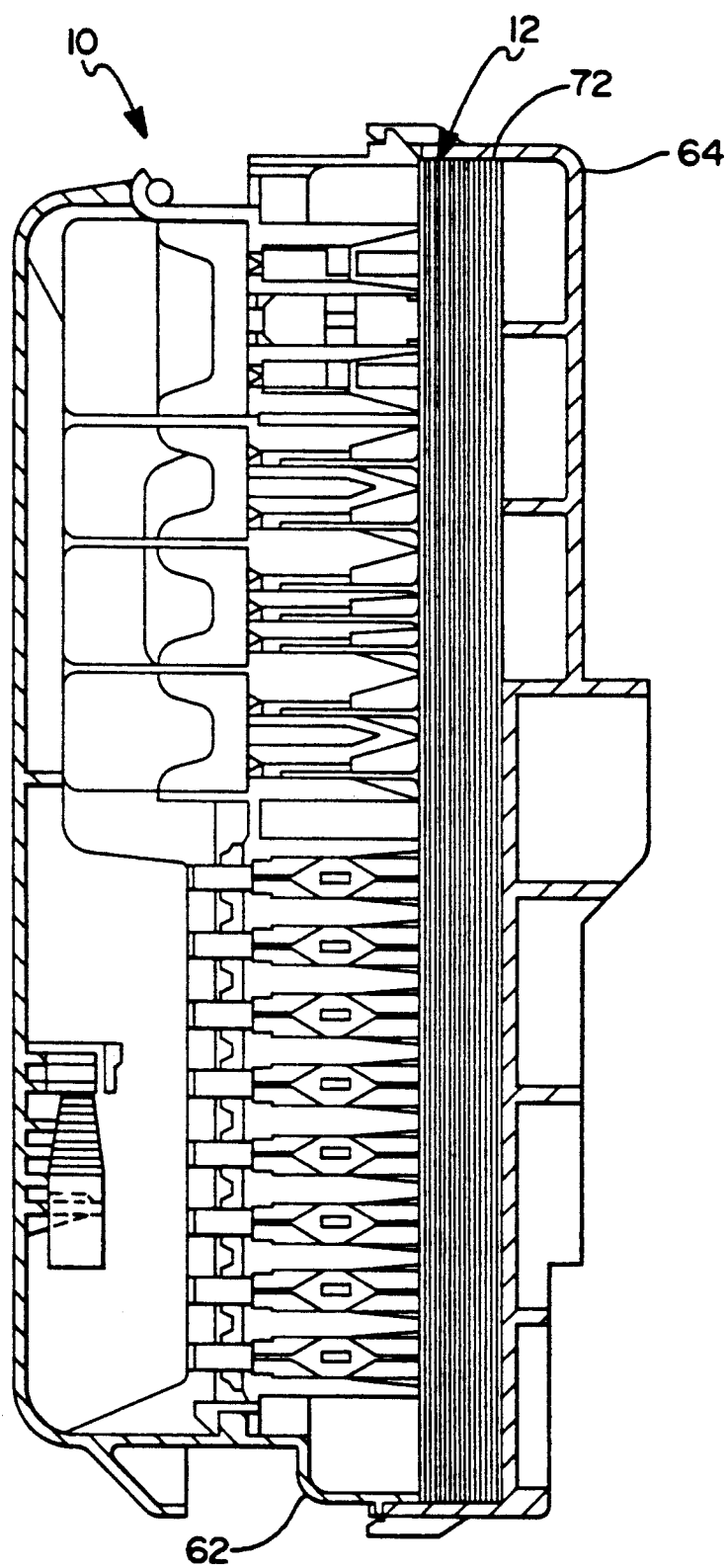
FIG. 7 is a sectional view of the junction box apparatus of FIG. 6 in assembled form showing a fret layer and the terminals of the busbar shunt of the junction box assembly.

Referring to FIG. 7, the junction box apparatus 10 is shown in a side view fully assembled. The junction box apparatus 10 generally forms a relatively compact apparatus which is particularly well suited to automotive applications.

It should be appreciated that in the preferred embodiment of the present invention all of the components of the present invention are made from widely available materials in accordance with widely known and implemented construction techniques.

Those skilled in the art can now appreciate from the foregoing description that the broad teachings of the present invention can be implemented in a variety of forms. Therefore, while this invention has been described in connection with particular examples thereof, the true scope of the invention should not be limited since other modifications will become apparent to the skilled practitioner upon study of the drawings, specification and following claims.

What is claimed is:

1. An apparatus forming a junction box having an integrally formed shunt for enabling a current within a current loop of a circuit to be accurately calculated by utilizing a voltage measured across said shunt by a voltage measuring device, without said junction box or said shunt affecting said measured voltage, said apparatus comprising:
    a junction box;
    a shunt integrally formed within said junction box such that said shunt may be coupled in said current loop when said junction box is in use;
    said shunt including a pair of terminals connectable to said voltage measuring device such that terminal resistances of said pair of terminals are outside of said current loop and thereby do not affect voltage measurements taken by said voltage measuring device.

2. The apparatus of claim 1, wherein said shunt comprises a metal fret shunt busbar integrally formed within said junction box.

3. The apparatus of claim 2, wherein said shunt comprises a resistance of approximately fifteen milliohms.

4. The apparatus of claim 3, wherein said shunt is formed from brass.

5. The apparatus of claim 4, wherein the brass comprises CDA 260 brass.

6. The apparatus of claim 5, wherein said CDA 260 brass has a conductivity of about 28 percent.

7. The apparatus of claim 1, wherein said shunt is interposed between adjacent insulating plates within said junction box so as to form an independent circuit path within said junction box while being integrally formed within said junction box.

8. An forming a junction box having an integrally formed shunt busbar therein, wherein said shunt busbar enables a voltage thereacross to be accurately measured when said shunt busbar is connected within a current loop of a circuit, without said junction box or said shunt busbar affecting said measured voltage and thus a current flow calculated in part from said measured voltage, said apparatus comprising:
    an upper case member;
    a lower case member;
    at least first, second and third insulation plates disposed between said upper and lower case members;
    a shunt busbar disposed between said second and third insulation plates;
    a busbar disposed between said first and second insulation plates;
    said upper and lower case members and said shunt busbar forming a junction box wherein said shunt busbar is integrally formed within said junction box;
    said shunt busbar including a first pair of terminals for coupling said shunt busbar within said current loop of said circuit, and a second pair of terminals for coupling a voltage measuring device across said shunt busbar in a manner so as not to affect a voltage measurement taken across said shunt busbar by said voltage sensing device.

9. The apparatus of claim 8, wherein said insulating plates each include mineral/glass filled material to thereby provide a dielectric between said shunt busbar and said busbar.

10. The apparatus of claim 9, wherein said upper and lower case members are adapted to be coupled together while said first, second and third insulating plates, and said shunt busbar are disposed therebetween to form said junction box, said shunt busbar providing said junction box with the capability of providing a shunt function without disassembling said junction box or incorporating an external shunt member.

* * * * *